US006531878B1

(12) United States Patent
Bystrom et al.

(10) Patent No.: US 6,531,878 B1
(45) Date of Patent: Mar. 11, 2003

(54) DIRECT CURRENT VOLTAGE DETECTION STICK

(75) Inventors: Lars Mats Jan Bystrom, Borås (SE); Carl Gunnar Klingberg, Svanesund (SE)

(73) Assignee: Sagab Electronic AB (SE)

( * ) Notice: Subject to any disclaimer, the term of this patent is extended or adjusted under 35 U.S.C. 154(b) by 0 days.

(21) Appl. No.: 09/432,026

(22) Filed: Oct. 29, 1999

(51) Int. Cl.[7] .................. G01R 31/28; G01R 27/26; G01R 31/02
(52) U.S. Cl. ............. 324/530; 324/72.5; 324/528; 324/690
(58) Field of Search ............. 324/72, 72.5, 66, 324/457, 149, 555, 556, 503, 527, 530, 528, 543, 690, 126, 127, 133

(56) References Cited

U.S. PATENT DOCUMENTS

| 2,698,921 A | * | 1/1955 | Wharton ................ 324/52 |
| 2,716,216 A | | 8/1955 | Schwenzfeier .......... 324/133 |
| 2,993,167 A | | 7/1961 | Smith .................... 324/529 |
| 3,621,384 A | | 11/1971 | Yamada .................. 324/52 |
| 3,639,833 A | | 2/1972 | Tachick ................. 324/51 |
| 4,506,210 A | | 3/1985 | Chase .................... 324/66 |
| 4,520,318 A | * | 5/1985 | Hascal et al. ............ 324/457 |
| 5,047,721 A | | 9/1991 | Farley ................... 324/414 |
| 5,193,108 A | | 3/1993 | Stocklin ................ 379/21 |
| 5,418,447 A | | 5/1995 | Beha et al. ............. 324/67 |
| 5,577,099 A | | 11/1996 | Clement et al. ......... 379/21 |

* cited by examiner

Primary Examiner—Michael Sherry
Assistant Examiner—Paresh Patel
(74) Attorney, Agent, or Firm—Fasth Law Offices; Rolf Fasth

(57) ABSTRACT

The receiver has a casing member and a tip is removably attached to the casing member. A transmitter is connected to a battery and the transmitter produces a transmitter signal by periodically connecting a resistance to the battery. Preferably, the transmitter signal has a frequency of about 20 kHz. A sensor may be placed adjacent to, but not in contact with, an electrically conductive member to take advantage of the air capacitance. An electrical field is created between the sensor and the electrically conductive member. Due to the periodical load on the battery, the sensor may sense the transmitter, signal in the DC carrying conductive member. The transmitter signal is passed through an integrated circuit to filter out all frequencies except the desired 20 kHz and a detection signal is sent to the indicator to activate the indicator.

10 Claims, 3 Drawing Sheets

DIRECT CURRENT VOLTAGE DETECTION STICK

TECHNICAL FIELD

The invention relates to a direct current (DC) voltage detection stick for non-contacting detection of a direct current in a wire by using the capacitance of air.

BACKGROUND INFORMATION AND SUMMARY OF THE INVENTION

Electrical voltage sticks are known in the art for both detecting alternating current (AC) and direct current (DC). The prior art voltage sticks may require that a needle is inserted through the plastic protection cover of the cable and into the metal wire to be able to detect the DC voltage. This leaves a permanent damage of the wire cover and water and other contaminants may enter into the opening after the needle has been withdrawn. This a particular problem in automobiles and other equipment that are operated in rain and snow conditions and have an electrical system that is powered a battery such as 12 or 24 VDC. Other DC testing devices rely on a relatively unreliable electromagnetism system for detecting cables carrying a DC current.

The present invention is a device and a method for detecting a direct current by using the capacitance in the air. The receiver has a casing member and a tip is removably attached to the casing member. A sensor is disposed within the casing member for sensing the presence of a transmitter signal when the sensor is positioned adjacent to an electrically conductive member carrying a direct current. An indicator and an integrated circuit is disposed within the casing member. The integrated circuit that may act as a first filter and a power source are disposed within the casing member for powering the sensor, the indicator and a first integrated circuit. A transmitter is connected to a direct current generating power source and the transmitter produces a transmitter signal by periodically connecting a resistance R to the battery. Preferably, the transmitter signal has a frequency of about 20 kHz. During detection, the tip is placed adjacent to, but not in contact with, the electrically conductive member to take advantage of the capacitance in the air disposed between the sensor and the electrically conductive member. Due to the period load on the battery, the sensor may sense the electrical field created between the two opposite poles of the battery. The detected transmitter signal is passed through the integrated circuit to filter out all frequencies except the desired 20 kHz and a direct current detection signal is sent to the indicator to activate the indicator.

DETAILED DESCRIPTION

Figure 1:
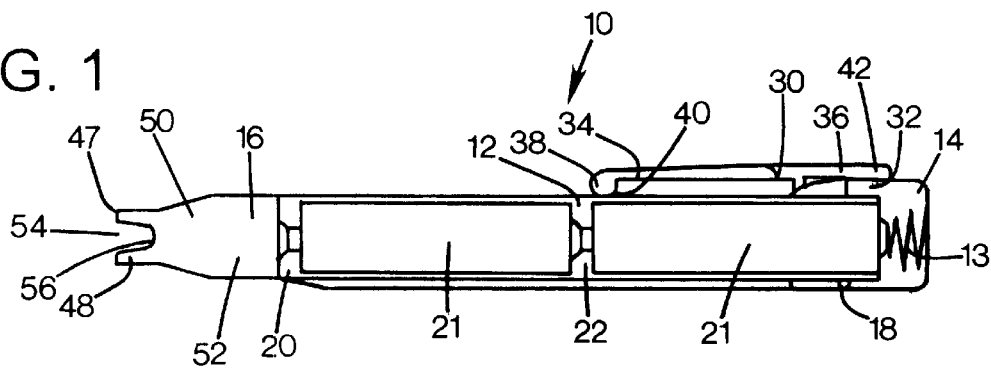
FIG. 1 is a cross-sectional side view of a casing of the DC volt detection stick of the present invention.
Figure 2:
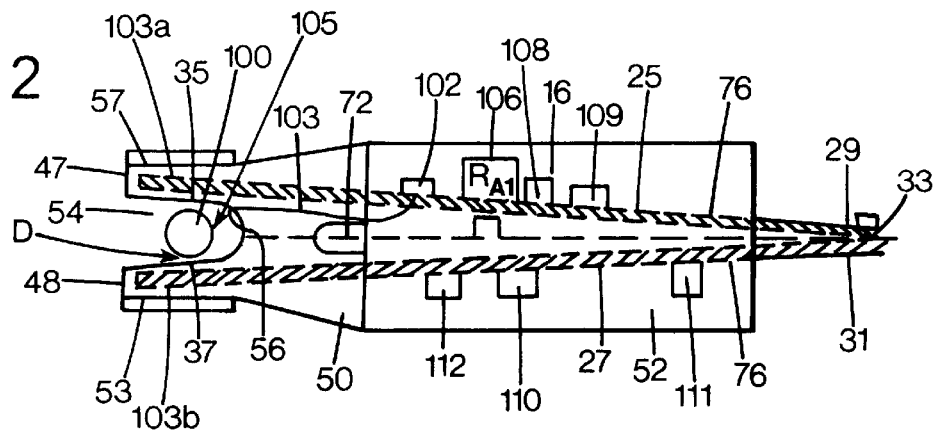
FIG. 2 is a detailed cross-sectional side view of a probe tip of the DC volt detection stick of the present invention.
Figure 3:
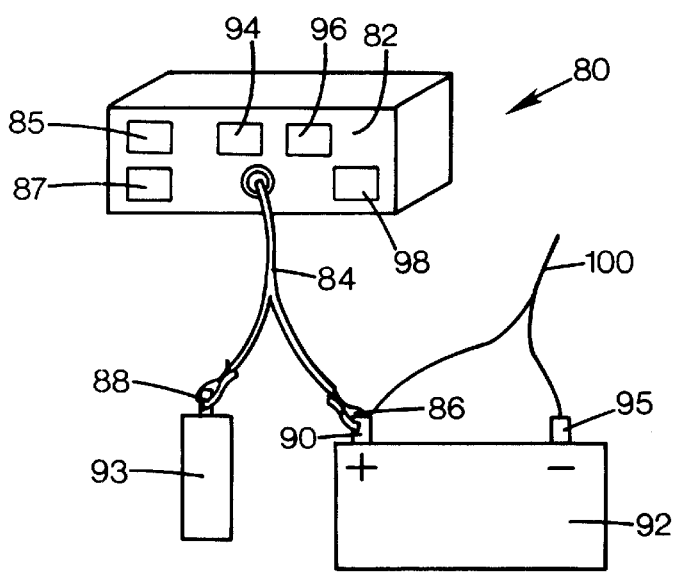
FIG. 3 is a perspective view of the transmitter end of the DC testing system of the present invention.
Figure 4:
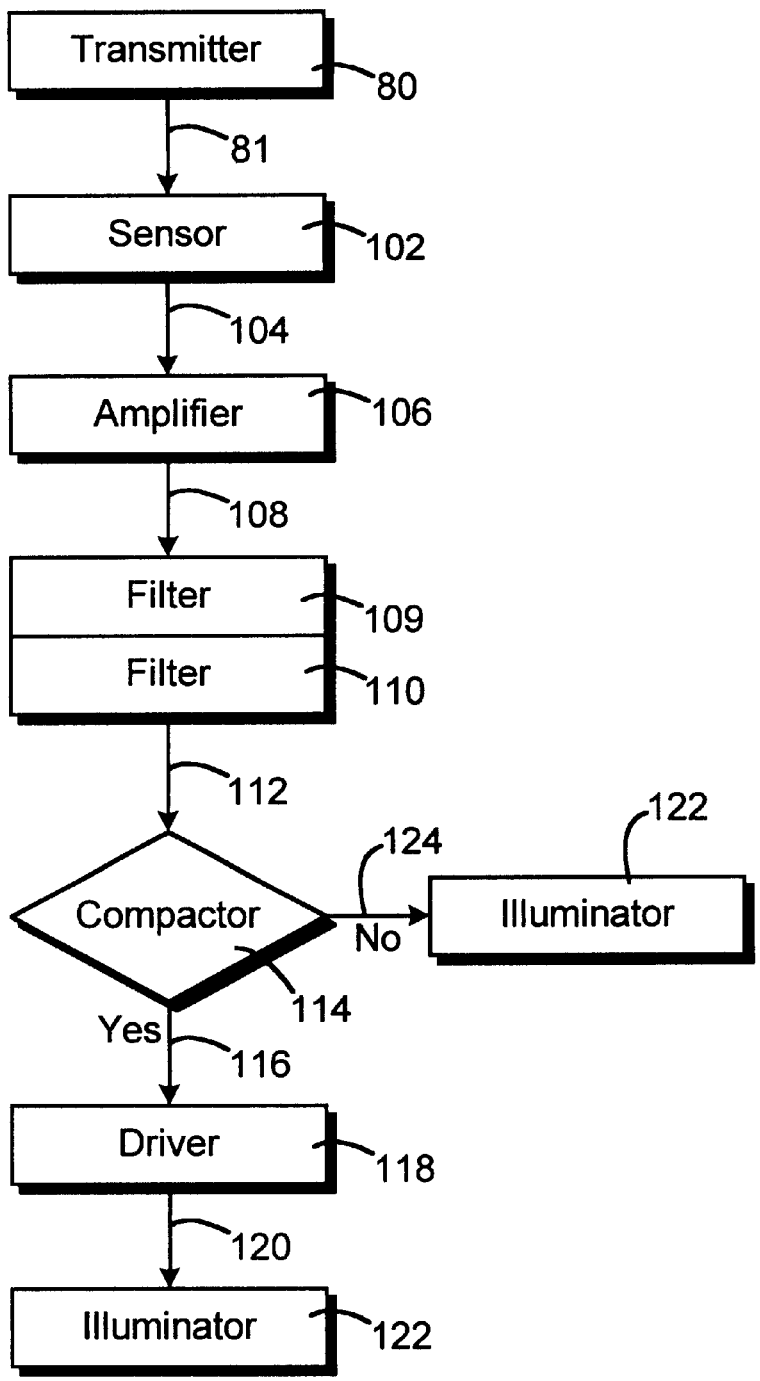
FIG. 4 is a schematical flow diagram showing the flow of signals in the DC testing system of the present invention.

With reference to FIGS. 1–3, the voltage probe or receiver 10 of the present invention comprises a casing 12, a battery cap 14 and a probe tip 16 so that the battery cap 14 may be attached to a rear end 18 of the casing 12 and the probe tip 16 may he removably attached to an opposite front end 20 of the casing 12. The battery cap 14 may be screwed onto the casing 12 and removed from the casing 12 by unscrewing the cap 14. A helical spring member 13 may be disposed and attached within the cap 14. The spring member 13 extends inwardly so that it comes into contact with a battery 21 when the cap is screwed onto the casing 12.

The casing 12 is preferably an elongate hollow member having a channel 22 extending therethrough. The hollow member is preferably made of a polymeric material such as polypropylene. Polypropylene provides good electrical insulation and is durable. The channel 22 may have a length that is dimensioned to hold two AAA-sized batteries 21.

A spring biased pocket clip 30 is, preferably, integrally formed with a side wall 32 of the casing 12 adjacent to the rear end 18 thereof. The clip 30 has a pocket holder 34 and a cap holder 36. The pocket holder 34 extends in a direction that is opposite to the cap holder 36. The cap holder 36 has an enlarged outer portion 38 including a perpendicular flat clamp surface 40. Similarly, the pocket holder 34 has a tip 42 that bears against the outer surface of the casing 12.

Preferably, the probe tip 16 has bifurcated or forklike narrow tip portions 47, 48 and a conical shaped mid-section 50 and a cylindrical rear portion 52. The tip portions 47, 48 define a groove 54 that has a round bottom 56 to safely hold a cord or wire therein to be tested. It is to be noted that the probe tip 16 is not glued to the casing 12 but is only firmly snapped or otherwise removably attached to the front portion 20. Preferably, the probe tip 16 is made of a polymeric material such as sicoamide-6 or any other suitable material. It is to be understood, the probe tip 16 does not have to be bifurcated but could be a single protruding end portion.

A first circuit board 25 and a second circuit board 27 may be disposed in the probe tip 16 and the casing 12. An inner end 29 of the board 25 and an inner end 31 of the board 27 may be mechanically and electrically connected to one another at a connection point 33 that is disposed outside the probe tip 16 and inside the casing 12. An outer end 35 of the board 25 extends into the tip portion 47 while an outer end 37 of the board 27 extends into the tip portion 48 so that the boards 25, 27 form a V-section. As discussed below, the boards 25, 27 shield and prevent the sensor inside the probe tip from sensing an adjacent wire that is located outside the groove 54. Preferably, the circuit boards 25, 27 may be made of a polymeric material such as a glass-fiber reinforced epoxy resin. Other suitable materials may also be used.

An indicator or light source 72 such as a surface mounted light emitting diode (led) or a 3 millimeter 700 mcd red led may also be electrically connected to the circuit boards 25, 27 and may be used to indicate that a direct current has been detected. A suitable buzzer may also be used to indicate that a direct current has been detected. For example, the led may be made by Citizen or any other suitable manufacturer. Light emitting diodes are the preferred type of light source because they provide a high intensity at a relatively low current. The light source 72 provides sufficient illumination so that the light emitted from the light source 72 may be seen through the probe tip 16.

An integrated circuit 76 is attached to the circuit board 25, 27.

As best seen in FIG. 3, the transmitter 80 has a housing 82 nay be made of ABS plastics or any other suitable material it wire 84 extends from the housing 82 and includes a first clip 86 and a second clip 88. The first clip 86 may be connected to the plus pole 90 of a battery 92 that powers the DC system to be tested while the second clip may be connected to, for example, a chassis part 93 of a vehicle or to a minus pole 95 of the battery 92.

Figure 6:
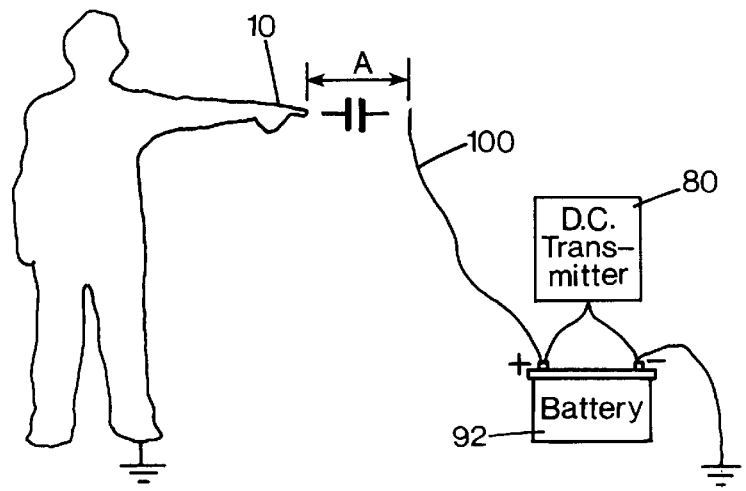
FIG. 6 is a schematical illustration of the use of the capacitance between the receiver and wire to be tested.

An important feature of the present invention is the use of the capacitance of air in the communication between the transmitter 80 and the receiver 10, as shown in FIG. 6. In general, two objects that are separated by air has a capacitance C therebetween. The capacitance C varies with the distance A. The capacitance C only permits alternating current (AC) to pass therethrough. Because the battery 92 produces a direct current, the transmitter 80 must produce a transmitter signal that is similar to an alternating current over the battery 92 so that the receiver may detect the transmitter signal. It is also important to note that there is no contact between the wire 100 to be tested and the sensor disposed inside the bifurcated probe tip 16 of the receiver 10.

In the present invention, the transmitter creates a current by periodically connecting a resistance 85 of the transmitter 80 so as to artificially create an alternating current that may pass the air capacitance C that is formed between the antennas 103a and 103b and the wire 100 that is disposed inside the bifurcated tip (see FIG. 2). It is important to note that there is no direct contact between the antennas 103a and 103b and the wire 100 and that there is a distance D therebetween.

The size of the resistance 85 used by the transmitter 80 depends upon the voltage of the battery 92. When the antennas 103 in the receiver 10 is sufficiently close to the wire 100, a detectable current $I_D$ is permitted to pass through a resistance 111 that is part of the circuitry 25, 27 of the receiver 10. The current $I_D$ is then amplified and filtered, as described below. In a modified version, it may be possible to only use an internal resistor $R_{A1}$ of the amplifier 106.

More particularly, the transmitter 80 produces a transmitter signal 81 at a frequency of between about 5 kHz and 40 kHz. More preferred, the frequency of the signal 81 is between about 15 kHz and 25 kHz. Most preferred, the frequency is about 20 kHz in periods of about 4 Hz to avoid unnecessary interference with other electrical equipment in a vehicle such as a car stereo or an alternator.

The periods of short circuiting of the battery 92 may vary from about 2 Hz and 10 Hz and results in the above described alternating current $I_D$ that may be detectable over the resistance 111. In general, a period in the range of about 1 second produces a flashing light 72 that is too slow at the receiver 10, as discussed below, because the operator needs to know if the wire is carrying direct current in the shortest possible time. In other words, it is too long to have to wait for one second to know if there is current in the wire to be measured. A frequency that is too high for the human eye cannot be seen by the operator as a blinking light but as a constant light. Therefore, a blinking light at 4 Hz is a suitable frequency.

As mentioned above, the size of the resistor 85 depends upon the voltage of the battery 92. The transmitter signal 81 may be produced by connecting a 1.5 Ohm resistor 85 to the transmitter 80 if the transmitter 80 is connected to a 12V electrical system or to a 3 Ohm resistor 87 if the transmitter 80 is connected to a 24V electrical system. Of course, other suitable resistor values may be used. In other words, the load or short circuiting of the battery 92 is performed at about 4 Hz intervals.

In a 12V electrical system, the short circuiting varies the voltage to be between 11.5V and 12.5V. Preferably, the voltage variation should be about 0.4 Vrms. More particularly, the variation should not be more than about 0.5 Vrms not to influence other electronic systems in, for example, a car. By operating at a frequency of about 20 kHz the artificially generated load of the battery 92 is not interfered by the normal load from the automobile because 20 kHz is above the operation of alternators and most car stereos. By increasing the revolutions per minute (rpm) of the engine sufficiently, it may also be possible to measure the operation of the alternator.

Figure 5:
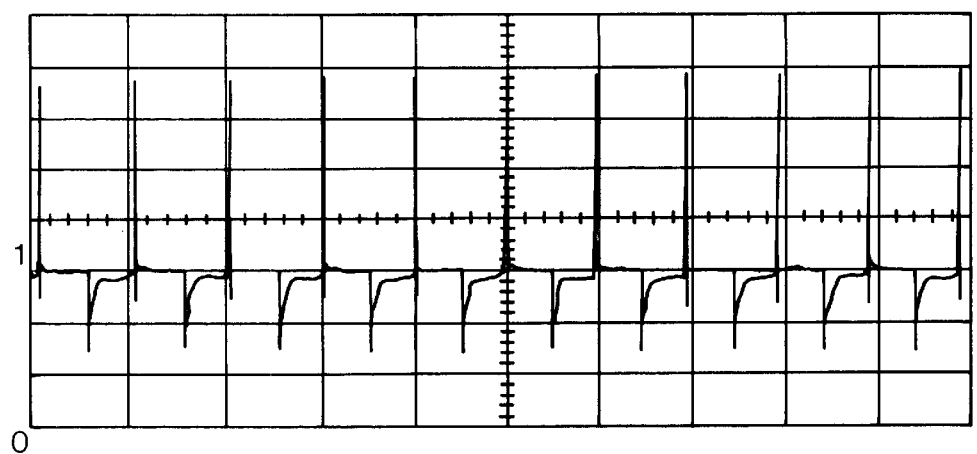
FIG. 5 is a schematical diagram showing the signals generated by the transmitter of the present invention.

The 20 kHz frequency has been selected to take advantage of the internal capacitance and resistance within most automobile batteries to increase the transmitter signal 81 both at the time of the short circuiting of the battery and when the short circuiting is terminated. FIG. 5 schematically shows the wave that results from the intermittent short circuiting of the battery wherein the transmission signal is at a frequency of 20 kHz. In general, the higher the frequency of the transmission signal, the easier it is for the signal to travel in the wire 100 to be tested. One limiting factor for the highest frequency that may effectively be used in the system is often the electronics at the receiver 10 because it is difficult, with the electronics currently available, to amplify a signal that has a frequency that is too high. Another limiting factor of using a frequency that is too high is the band width of the amplifier. A too high of a frequency may produce a radio signal may undesirably reduce the selectivity.

The housing 82 of the transmitter 80 has an indicator lamp 94 that may emit a red light, to indicate that the transmitter is incorrectly connected, or a blinking green light, to indicate that the transmitter 80 is operating correctly. The electronics in the transmitter 80 is supervised by a micro-controller 96 that generates all the signals required.

The micro-controller 96 has a sensor 98 that senses if there is any direct current flowing in the clips 86, 88 and if the transmitter 80 is connected to a 12V or a 24V electrical system. The transmitter 80 also has a protective circuit to protect the transmitter from damage as a result of over-loading, over-heating or polarization.

When the tips 47, 48 of the probe tip 16 are placed over a wire 100 (see FIG. 2) connected to the transmitter 80 via the battery 92, the light 72 of the probe tip 16 may flash to indicate that the receiver 10 has detected the transmitter signal 81 at 20 KHz in the wire 100 to be tested. The fork like tip enhances the sensitivity of the receiver 10 when measuring a wire that is disposed in a harness of wires. The fork like tip also ensures that the correct wire is measured.

The circuit boards 25, 27 disposed in the receiver 10 may include a sensor 102 that is connected to the antenna 103 for sensing the transmitter signal 81 in the wire 100. When the transmitter signal 81 is detected from the transmitter 80, an amplification signal 104 is sent from the sensor 102 to a high impedance amplifier 106 to amplify the transmitter signal to a workable level. A selection signal 108 is sent from the amplifier 106 to two band pass filters 109, 110 that may be part of the integrated circuits to filter out all noise in the selection signal 108 except the desired 20 kHz frequency of the frequency signal 112. The integrated circuits themselves may act as filters. The frequency signal 112 is sent from the filter 110 to a comparator 114 that compares the level of the signal 112 to a preset level. In the preferred embodiment, the preset level is 20 mV. The preset level could range from about 10 mV to about 400 mV. If the preset level is too high, then the resistance of the wire itself may reduce the signal too much so that the antenna 103 and thus the sensor 102 cannot detect the transmitter signal 81.

If the level of the signal 112 exceeds the preset level, then a triggering signal 116 is sent to the led driver 118 that is turn sends an illumination signal 120 to the illuminator 72, such as a LED indicator, to emit a flashing light indicating that the receiver 10 has detected the transmitter signal 81 in the wire 100 that was transmitted by the transmitter 80 and therefore the wire 100 is properly connected to the battery 92 and carries a sufficiently strong direct current. The system must be correctly connected to produce the light that indicates that everything is properly connected.

While the present invention has been described in accordance with preferred compositions and embodiments, it is to be understood that certain substitutions and alterations may be made thereto without departing from the spirit and scope of the following claims.

We claim:

1. A method of detecting a direct current in an electrically conductive member, comprising:
    (a) providing a receiver having a casing member, a bifurcated tip removably attached to the casing member, a first circuit board and a second circuit board disposed within the casing member, the bifurcated tip having a first leg and a second leg defining a cavity, the first circuit board extending into the first leg and the second circuit board extending into the second leg;
    (b) providing a transmitter that is connected to a direct current power source having two poles;
    (c) the transmitter producing a transmitter signal by alternatively connecting the transmitter to and disconnecting the transmitter from a transmitter resistance, the transmitter resistance being electrically connected to the transmitter and the transmitter transmitting the transmitter signal into an electrically conductive member electrically connected to the power source and the transmitter;
    (d) placing the bifurcated tip immediately adjacent to the electrically conductive member without contacting the electrically conductive member so that the electrically conductive member is placed in the cavity between the first circuit board disposed in the first leg and the second circuit board disposed in the second leg to shield the electrically conductive member with the first and second circuit boards;
    (e) a sensor, attached to the first circuit board, sensing the transmitter signal in the electrically conductive member; and
    (f) passing the transmitter signal through the integrated circuit.

2. The method according to claim 1 wherein step (e) further comprises amplifying the transmitter signal.

3. The method according to claim 1 wherein step (e) further comprises sending the transmitter signal to a comparison device to compare the transmitter signal to a preset level, sending a triggering signal to the indicator when the transmitter signal is greater than the preset level.

4. The method according to claim 1 wherein the frequency F is between about 1 kHz and about 100 kHz.

5. The method according to claim 1 wherein the frequency F is about 20 kHz.

6. The method according to claim 1 wherein step (c) further comprises periodically transmitting the frequency F in bursts at a frequency of about 4 Hz.

7. The method according to claim 1 wherein the method further comprises sending a detection signal to the indicator to activate the indicator.

8. A direct current detection system for non-contacting testing of an electrically conductive member carrying a direct current, comprising:
    a transmitter connected to a direct current power source, the transmitter having a controller for periodically connecting the power source to a transmitter resistance to generate a transmitter signal;
    a receiver having a front and a back;
    a tip removably attached to the front of the receiver, the tip having a bifurcated portion having a first leg and a second leg.
    a first antenna disposed in the first leg and a second antenna disposed in the second leg for sensing the transmitter signal and transmitting a detection signal when the electrically conductive member carrying the direct current is positioned within the bifurcated portion and the antennas are being positioned adjacent to the conductive member;
    a first circuit board disposed within the first leg and a second circuit board disposed within the second leg, an integrated circuit mounted on the first circuit board; and
    an indicator electrically connected to the integrated circuit and emitting a light when the transmitter signal has passed through the integrated circuit.

9. The direct current testing system according to claim 8 wherein the first circuit board and the second circuit board form a V-shape to shield the antennas disposed therebetween.

10. The direct current testing system according to claim 8 wherein the transmitter signal has a frequency of about 20 kHz and the transmitter is connected at a frequency of about 4 Hz.

* * * * *